«12» United States Patent
Komatsu et al.

(10) Patent No.: US 11,546,989 B2
(45) Date of Patent: Jan. 3, 2023

(54) MULTILAYER BOARD INSULATING SHEET, MULTILAYER BOARD, AND METHOD OF MANUFACTURING MULTILAYER BOARD

(71) Applicant: TDK CORPORATION, Tokyo (JP)

(72) Inventors: Seiko Komatsu, Tokyo (JP); Takaaki Morita, Tokyo (JP); Seiichi Tajima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/813,025

(22) Filed: Mar. 9, 2020

(65) Prior Publication Data

US 2020/0315008 A1 Oct. 1, 2020

(30) Foreign Application Priority Data

Mar. 29, 2019 (JP) .............................. JP2019-068661

(51) Int. Cl.
*H05K 1/11* (2006.01)
*H05K 1/03* (2006.01)
*H05K 1/09* (2006.01)
*H05K 3/46* (2006.01)

(52) U.S. Cl.
CPC ........... *H05K 1/112* (2013.01); *H05K 1/0373* (2013.01); *H05K 1/09* (2013.01); *H05K 3/4626* (2013.01); *H05K 3/4655* (2013.01); *H05K 3/4682* (2013.01); *H05K 2203/068* (2013.01)

(58) Field of Classification Search
CPC ........ H05K 1/112; H05K 1/0373; H05K 1/09; H05K 3/4626; H05K 3/4655; H05K 3/4682; H05K 2203/068
USPC .......................................................... 174/257
See application file for complete search history.

(56) References Cited

U.S. PATENT DOCUMENTS

| 4,882,377 | A | * | 11/1989 | Sweet | ................... | A61L 15/585 |
| | | | | | | 524/379 |
| 5,952,718 | A | * | 9/1999 | Ohtsuka | ................... | H01L 24/83 |
| | | | | | | 257/737 |
| 2003/0133275 | A1 | | 7/2003 | Miyake et al. | | |
| 2005/0153220 | A1 | | 7/2005 | Yanaguchi | | |
| 2007/0119541 | A1 | * | 5/2007 | Kawabata | ............ | H05K 3/0058 |
| | | | | | | 156/307.7 |
| 2009/0133926 | A1 | * | 5/2009 | Kambe | ................... | C08L 23/10 |
| | | | | | | 174/72 A |
| 2009/0166613 | A1 | * | 7/2009 | Lee | ........................ | H01L 51/052 |
| | | | | | | 257/40 |

FOREIGN PATENT DOCUMENTS

| JP | H04-346494 | A | 12/1992 |
| JP | H10-294568 | A | 11/1998 |
| JP | 2001-284817 | A | 10/2001 |
| JP | 2003-332749 | A | 11/2003 |
| JP | 2005-197305 | A | 7/2005 |
| WO | 2018/079198 | A1 | 5/2018 |

* cited by examiner

*Primary Examiner* — Tremesha S Willis
(74) *Attorney, Agent, or Firm* — Oliff PLC

(57) ABSTRACT

A multilayer board insulating sheet contains a reducing agent.

15 Claims, 14 Drawing Sheets

Cu-Sn Bonding Layer

Cu-Sn Bonding Layer

Cu-Sn Bonding Layer

Sn-Ag Plating Layer

MULTILAYER BOARD INSULATING SHEET, MULTILAYER BOARD, AND METHOD OF MANUFACTURING MULTILAYER BOARD

BACKGROUND OF THE INVENTION

1. Field of the Invention

The present invention relates to a multilayer board insulating sheet, a multilayer board, and a method of manufacturing a multilayer board.

2. Description of the Related Art

As a multilayer board embedded with passive elements such as capacitors, for example, a passive element embedded board disclosed in JP 2003-332749 A described below is known.

In JP 2003-332749 A, a conductive composition integrated by sintering a conductive paste in a via-hole is diffused and bonded to adjacent conductor patterns. Therefore, interlayer connection between the adjacent conductor patterns is performed. However, this method has low connection reliability.

SUMMARY OF THE INVENTION

The invention has been made in view of such circumstances, and an object of the invention is to provide an multilayer board insulating sheet, a multilayer board, and a method of manufacturing the multilayer board capable of improving connection between a post electrode of one board unit and a conductor wiring layer of another board unit adjacent to the board unit in the multilayer board.

In order to achieve the above object, the multilayer board insulating sheet according to the invention contains a reducing agent.

In the invention, the connection between the conductor post of one board unit and the intermediate wiring layer of another board unit adjacent to the board unit is improved without generating cracks. As the reason, it is considered that this is because, since the reducing agent is contained in the multilayer board insulating sheet, even at the time of performing the collective stacking hot-pressing in the air atmosphere, by volatilizing and decomposing the reducing agent, the oxide film formed on the surface of the conductor connection film can be removed at the time of performing the collective stacking hot-pressing. As a result, it is considered that the metal constituting the conductor connection film is easily melted at the time of the collective stacking hot-pressing, air gaps are hardly generated, and the metal constituting the conductor connection film can be wetted and spread over the entire surface of the conductor post.

In the multilayer board insulating sheet according to the invention, preferably, the conductor post is buried in the insulating layer of the multilayer board insulating sheet.

By stacking and hot-pressing the multilayer board insulating sheet having such a conductor post, three-dimensional circuit connection for connecting elements such as capacitors and circuits can be implemented.

In the multilayer board insulating sheet according to the invention, preferably, a conductor connection film is provided on the top surface of the conductor post, and the conductor connection film is comprised of at least one selected from Sn, Ag, Sn—Ag, Cu—Ag, and Sn—Cu.

As described above, since the metal constituting the conductor connection film has a relatively low melting point, the connection between the conductor post of one board unit and the intermediate wiring layer of another board unit adjacent to the board unit is improved. In addition, in the invention, the insulating layer contains a reducing agent. For this reason, even if the above-mentioned metal is selected as the metal constituting the conductor connection film, by volatilizing and decomposing the reducing agent, the oxide film formed on the surface of the conductor connection film can be removed at the time of performing the collective stacking hot-pressing.

In the multilayer board insulating sheet according to the invention, the insulating layer preferably contains the reducing agent having an amount of 30 to 200 ppm by mass.

Thus, the effect of removing the oxide film can be further improved, and the generation of air gaps (voids) in the insulating layer due to the reducing agent can be suppressed.

The multilayer board insulating sheet according to the invention preferably further includes a thermoplastic resin, in which, when the melting point of the thermoplastic resin is denoted by T1, the boiling point, the decomposition temperature, or the sublimation temperature of the reducing agent is denoted by T2, and the melting point of the metal constituting the conductor connection film is denoted by T3, the relationship of $T2 \leq T3 < T1$ is satisfied.

Accordingly, it is possible to volatilize the reducing agent by the heat at the time of manufacturing the multilayer board and to melt the metal constituting the conductor connection film while preventing the structure of the insulating layer from being damaged by excessive heat.

A multilayer board according to the invention includes: a board main body having a plurality of insulating layers;
an intermediate wiring layer formed between the insulating layers; and
a post electrode formed inside the insulating layer so as to be electrically connected to a portion of the intermediate wiring layer,
in which at least one of the insulating layers contains a reducing agent.

According to the invention, the connection between the post electrode of one board unit and the intermediate wiring layer of another board unit adjacent to the board unit is improved without generating cracks. As the reason, it is considered that this is because, by volatilizing and decomposing the reducing agent contained in the insulating layer, the oxide film formed on the surface of the conductor connection film can be removed at the time of performing the collective stacking hot-pressing.

In the multilayer board according to the invention, preferably, a portion of the intermediate wiring layer and the post electrode are electrically connected to each other via a conductor connection film, and
the metal the conductor connection film is comprised of at least one selected from Sn, Ag, Sn—Ag, Cu—Ag, and Sn—Cu.

As described above, since the metal constituting the conductor connection film has a relatively low melting point, the connection between the post electrode of one board unit and the intermediate wiring layer of another board unit adjacent to the board unit is improved. In addition, in the invention, the insulating layer contains a reducing agent. For this reason, even if the above-mentioned metal is selected as the metal constituting the conductor connection film, by volatilizing and decomposing the reducing agent, the oxide film formed on the surface of the conductor connection film can be removed at the time of performing the collective stacking hot-pressing.

In the multilayer board according to the invention, at least one of the insulating layers preferably contains the reducing agent having an amount of 5 to 100 ppm by mass.

Thus, the effect of removing the oxide film can be further improved, and the generation of air gaps (voids) in the insulating layer by the reducing agent can be suppressed.

The multilayer board according to the invention preferably further includes a thermoplastic resin, in which, when the melting point of the thermoplastic resin is denoted by T1, the boiling point, the decomposition temperature, or the sublimation temperature of the reducing agent is denoted by T2, and the melting point of the metal constituting the conductor connection film is denoted by T3, the relationship of $T2 \leq T3 < T1$ is satisfied.

Accordingly, it is possible to volatilize the reducing agent by the heat at the time of manufacturing the multilayer board and to melt the metal constituting the conductor connection film, while preventing the structure of the insulating layer from being damaged by excessive heat.

A method of manufacturing a multilayer board according to the invention includes: forming a first conductor film having a first predetermined pattern on a surface of a first support board;

forming a first conductor post to be a first post electrode on a portion of the first conductor film and applying a first insulating layer resin powder for forming a first insulating layer on the first conductor film;

forming a first board unit by performing first hot-pressing on the first insulating layer resin powder;

forming a second conductor film having a second predetermined pattern on a surface of a second support board;

forming a second conductor post to be a second post electrode on a portion of the second conductor film and applying a second insulating layer resin powder for forming a second insulating layer on the second conductor film;

forming a second board unit by performing second hot-pressing on the second insulating layer resin powder; and bonding a stacked body including at least the first board unit and the second board unit by performing collective stacking hot-pressing, in which at least one of the first insulating layer resin powder and the second insulating layer resin powder contains a reducing agent.

In the invention, the connection between the conductor post of one board unit and the intermediate wiring layer of another board unit adjacent to the board unit is improved without generating cracks. As the reason, it is considered that this is because, by volatilizing and decomposing the reducing agent contained in at least one of the first board unit and the second board unit, the oxide film formed on the surface of the conductor connection film can be removed at the time of performing the collective stacking hot-pressing.

The method of manufacturing the multilayer board according to the invention preferably further includes forming a conductor connection film on a top surface of the first conductor post and/or the second conductor post, in which, when the stacked body including the first board unit and the second board unit is bonded by hot-pressing, the conductor connection film is simultaneously connected to a conductor film formed on the lower surface of another board unit stacked on the first board unit and/or the second board unit, and in which the conductor connection film is comprised of at least one selected from Sn, Ag, Sn—Ag, Cu—Ag, and Sn—Cu.

As described above, since the metal constituting the conductor connection film has a relatively low melting point, the connection between the conductor post of one board unit and the intermediate wiring layer of another board unit adjacent to the board unit is improved. In addition, in the invention, at least one of the first board unit and the second board unit contains a reducing agent. For this reason, even if the above-mentioned metal is selected as the metal constituting the conductor connection film, by volatilizing and decomposing the reducing agent, the oxide film formed on the surface of the conductor connection film can be removed at the time of performing the collective stacking hot-pressing.

The method of manufacturing the multilayer board according to the invention preferably further includes a thermoplastic resin, in which, when the melting point of the thermoplastic resin is denoted by T1, the boiling point, the decomposition temperature, or the sublimation temperature of the reducing agent is denoted by T2, and the melting point of the metal constituting the conductor connection film is denoted by T3, the relationship of $T2 \leq T3 < T1$ is satisfied.

Accordingly, it is possible to volatilize the reducing agent by the heat at the time of manufacturing the multilayer board and to melt the metal constituting the conductor connection film, while preventing the structure of the insulating layer from being damaged by excessive heat.

A multilayer board according to the invention can be manufactured by any one of the above-described methods of manufacturing the multilayer board.

DETAILED DESCRIPTION OF THE PREFERRED EMBODIMENTS

Figure 1:
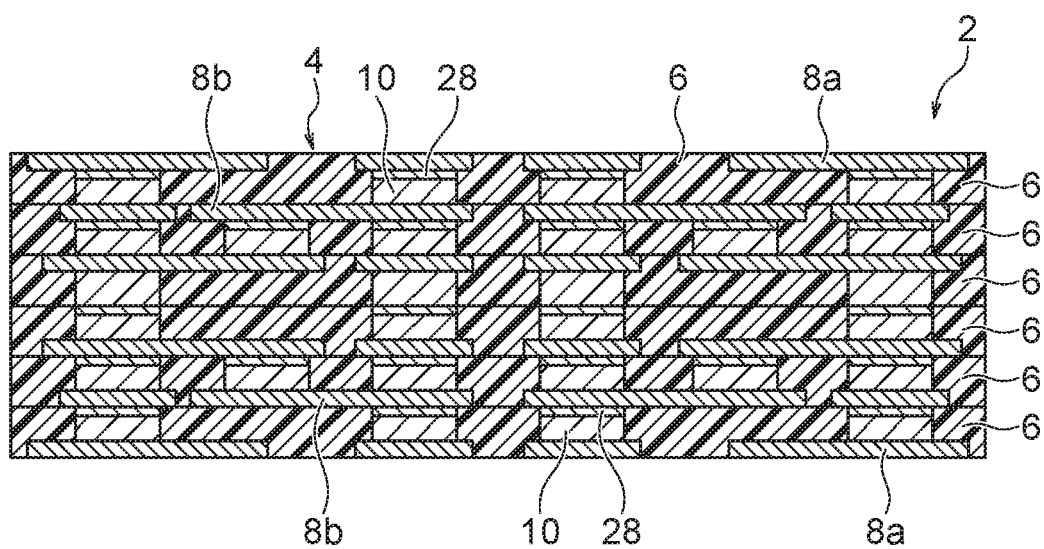
FIG. 1 is a schematic cross-sectional view of a multilayer board according to one embodiment of the invention.
Figure 1:
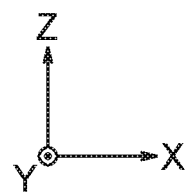

Hereinafter, the invention will be described on the basis of embodiments illustrated in the drawings.

First Embodiment

As illustrated in FIG. 1, a multilayer board 2 according to one embodiment of the invention includes a board main body 4. The board main body 4 has a plurality of insulating layers 6 stacked in a Z-axis direction. An intermediate wiring layer 8b as a conductor wiring layer is formed in a predetermined pattern in an X-axis direction and a Y-axis direction between the insulating layers 6 adjacent to each other in the stacking direction. In addition, a surface wiring layer 8a as a conductor wiring layer is formed in a predetermined pattern in the X-axis direction and the Y-axis direction on an outer surface of the insulating layer 6 located on the outermost side in the stacking direction.

In addition, in the drawings, the Z-axis coincides with the stacking direction of the insulating layers, and the X-axis and the Y-axis are substantially parallel to a plane in which the surface wiring layer 8a and the intermediate wiring layer 8b extend. The X, Y, and Z axes are substantially perpendicular to each other.

As illustrated in FIG. 1, in order to connect the surface wiring layer 8a and the intermediate wiring layer 8b (electrically/hereinafter, unless otherwise specified) or to connect the intermediate wiring layers 8b located in different layers to each other, through-holes penetrating in the Z-axis direction are formed in each insulating layer 6, and a post electrode 10 for connection is buried in the through-holes.

Each insulating layer 6 contains a reducing component. The insulating layer 6 of the present embodiment is configured with, for example, a thermoplastic resin and a reducing agent.

The thermoplastic resin of the present embodiment is not particularly limited, but from the viewpoint of high-frequency characteristics (dielectric constant, dielectric loss tangent), low water absorption, and heat resistance (reflow resistance characteristics), the thermoplastic resin is preferably configured with a liquid crystal polymer (LCP) such as a crystalline polyester.

The structure of the LCP is not particularly limited. As the structure of the LCP, a structure represented by the following chemical formula (1) may be exemplified.

The insulating layer 6 of the present embodiment contains a reducing agent. The reducing agent contained in the insulating layer 6 of the present embodiment is not particularly limited. As the reducing agent contained in the insulating layer 6 of the present embodiment includes, an organic compound having a carboxyl group or an aldehyde group or the like may be exemplified.

As the organic compound, saturated fatty acids, unsaturated fatty acids, aromatic carboxylic acids, dicarboxylic acids, oxocarboxylic acids, rosins, or the like may be exemplified. In addition, one type of the reducing agent may be used individually, or two or more types of the reducing agents may be used together.

As the saturated fatty acid, formic acid, propionic acid, or the like may be exemplified. As the unsaturated fatty acid, oleic acid, linoleic acid, or the like may be exemplified. As the aromatic carboxylic acid, benzoic acid, phthalic acid, terephthalic acid, salicylic acid, or the like may be exemplified. As the dicarboxylic acid, oxalic acid, malonic acid, glutaric acid, fumaric acid, maleic acid, or the like may be exemplified. As the oxocarboxylic acid, pyruvic acid, oxaloacetic acid, or the like may be exemplified.

In the present embodiment, in a case where the LCP is contained in the insulating layer 6, the reducing agent is preferably an aromatic carboxylic acid. Since the aromatic carboxylic acid has an affinity for the LCP having a benzene ring, the aromatic carboxylic acid can be uniformly distributed in the insulating layer 6.

When that the boiling point, decomposition temperature or sublimation temperature of the reducing agent is denoted by T2, T2 is preferably 100 to 300° C., more preferably 200 to 250° C. Accordingly, the reducing agent is not volatilized excessively at the time of the sheet molding hot-pressing described later, the reducing agent can be volatilized at the temperature at the time of the collective stacking hot-pressing described later, and the effect of removing the oxide film can be exhibited.

In the present embodiment, the reducing agent contained in the insulating layer 6 is preferably at least one selected from benzoic acid, phthalic acid, terephthalic acid and salicylic acid, more preferably benzoic acid or salicylic acid.

The boiling point of benzoic acid is 249° C., the decomposition temperature of phthalic acid is 210° C., the sublimation temperature of terephthalic acid is 300° C., and the boiling point of salicylic acid is 211° C.

The insulating layer 6 of the present embodiment preferably contains a reducing agent having an amount of 30 to 200 ppm by mass, more preferably 50 to 100 ppm by mass.

Since the content of the reducing agent in the insulating layer 6 is within the above range, the effect of removing the oxide film can be obtained, and the generation of air gaps (voids) in the insulating layer 6 by the reducing agent can be suppressed.

The surface wiring layer 8a and the intermediate wiring layer 8b are not particularly limited as long as the surface wiring layer 8a and the intermediate wiring layer 8b have conductivity and can be easily patterned. For example, surface wiring layer 8a and the intermediate wiring layer 8b are configured with Cu, Ni, Ti, Ag, Al, Au, Zn, Mo, or an

[Chemical Formula 1]

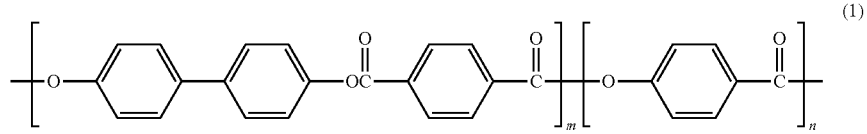

alloy thereof. The post electrode 10 is also configured with the same metal (including an alloy) as the surface wiring layer 8a or the intermediate wiring layer 8b, but the post electrode 10 is not necessarily configured with the same. The surface wiring layer 8a and the intermediate wiring layer 8b are also configured with the same metal, but the surface wiring layer 8a and the intermediate wiring layer 8b are not necessarily configured with the same.

In addition, preferably, a conductor connection film 28 is interposed between the post electrode 10 and the intermediate wiring layer 8b or between the post electrode 10 and the surface wiring layer 8a. The conductor connection film 28 is preferably configured with a metal having a melting point lower than that of the metal constituting the surface wiring layer 8a and the intermediate wiring layer 8b or the post electrode 10. The melting point of the metal constituting the conductor connection film 28 is preferably lower than the temperature at which the insulating layer 6 is fused in the stacking direction by the hot-pressing. At the time of the hot-pressing, simultaneously, the post electrode 10 can be connected to the intermediate wiring layer 8b or the surface wiring layer 8a via the conductor connection film 28.

The metal constituting the conductor connection film 28 is not particularly limited. The metal constituting the conductor connection film 28 is, for example, Sn, Ag, Sn—Ag, Cu—Ag, Sn—Cu, Sn—Ni, Sn—Zn, or the like, preferably at least one selected from Sn, Ag, Sn—Ag, Cu—Ag, and Sn—Cu, more preferably Sn—Ag or Sn—Cu.

When the melting point of the thermoplastic resin is denoted by T1 and the melting point of the metal constituting the conductor connection film 28 is denoted by T3, it is preferable that T1, T2, and T3 satisfy T2 (boiling point, decomposition temperature, or sublimation temperature of the reducing agent)≤T3<T1.

Accordingly, it is possible to volatilize the reducing agent and to melt the metal constituting the conductor connection film 28 at the time of the collective stacking hot-pressing described later, while preventing the structure of the insulating layer 6 from being damaged by excessive heat.

Specifically, T3 is preferably by about 10 to 50° C., more preferably by about 20 to 40° C. lower than T1.

In addition, T3 is preferably by about 0 to 40° C., more preferably by about 10 to 30° C. higher than T2.

In the present embodiment, the thickness of each insulating layer 6 in the Z-axis direction is not particularly limited, but the thickness is preferably 30 to 100 µm. The thickness of each insulating layer 6 corresponds to the height of each post electrode 10 in the Z-axis direction. The thicknesses of the surface wiring layer 8a and the intermediate wiring layer 8b are not particularly limited, but the thicknesses are preferably 5 to 20 µm. The thickness of the conductor connection film 28 is not particularly limited, but the thickness is preferably 2 to 10 µm.

In addition, the pattern line thickness of each surface wiring layer 8a or each intermediate wiring layer 8b is not particularly limited, but the pattern line thickness can be preferably 10 µm or less, more preferably 7 µm or less. The outer diameter of the post electrode 10 is also not particularly limited, but the outer diameter may be preferably 20 µm to 100 µm, more preferably 30 to 60 µm.

Next, a method of manufacturing the multilayer board 2 having the multilayer structure illustrated in FIG. 1 will be described in detail.

Figure 2:
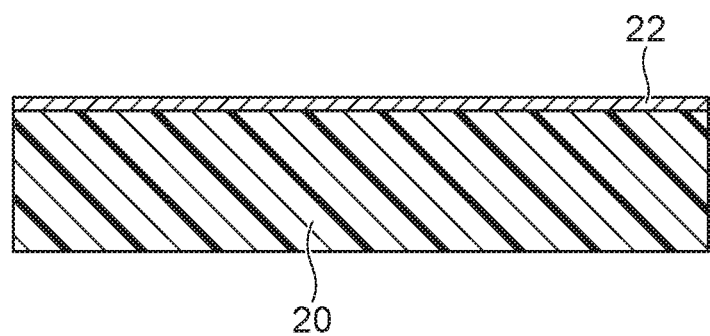
FIG. 2 is a schematic cross-sectional view illustrating a process of manufacturing the multilayer board illustrated in FIG. 1.
Figure 2:
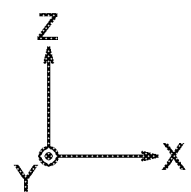

First, as illustrated in FIG. 2, a support board 20 is prepared. The support board 20 is not particularly limited, but a metal plate such as a SUS plate, a resin sheet such as a polyimide film, a high heat-resistant board such as a glass epoxy board, and others are exemplified. As the support board 20, any board that can be handled and has heat resistance that can withstand the pressing temperature (melting temperature) of the insulating layer configured with a thermoplastic resin may be employed.

The underlying conductor film 22 is preferably formed on the surface of the support board 20 in advance, but the underlying conductor film 22 prepared separately from the support board 20 may be attached to the surface of the support board 20. The underlying conductor film 22 is a film serving as a seed for forming a plating film in a later process and is configured with, for example, a metal film of Cu, a copper alloy, or the like.

The underlying conductor film 22 may be formed on the surface of the support board 20 by sputtering or the like, but the underlying conductor film 22 is preferably formed by a method that can be peeled off later with the support board. For example, a thermoplastic polyimide board adhered with an ultra-thin copper foil adhered with a carrier is used as a support board 20 to improve handling properties. However, an ultra-thin copper foil itself adhered with a carrier may be used as a support board 20 adhered with underlying conductor film 22.

Figure 3:
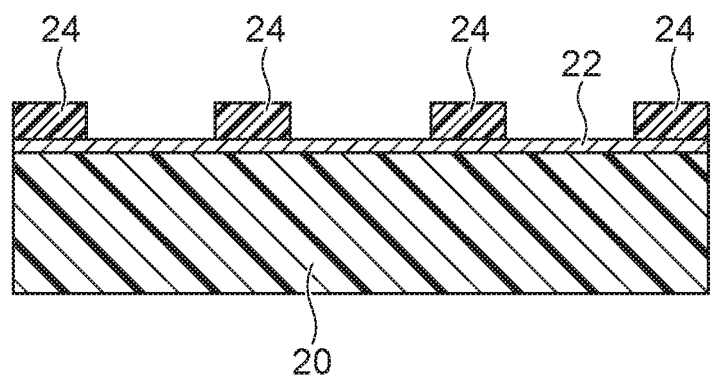
FIG. 3 is a schematic cross-sectional view illustrating a process subsequent to that of FIG. 2.
Figure 3:
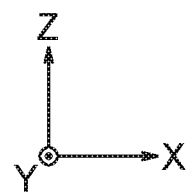

Next, as illustrated in FIG. 3, the first resist film 24 having a predetermined pattern is formed on the underlying conductor film 22 of the support board 20.

Figure 4:
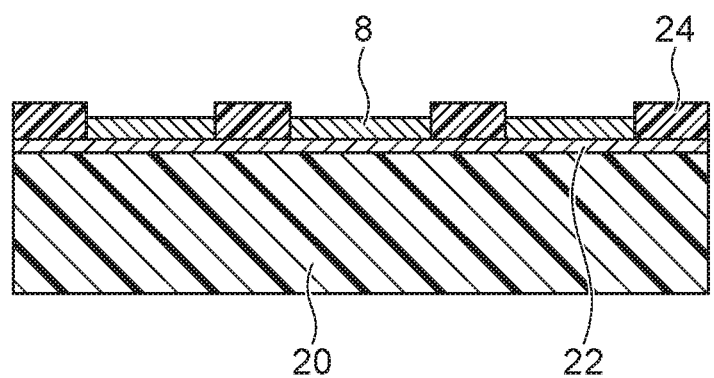
FIG. 4 is a schematic cross-sectional view illustrating a process subsequent to that of FIG. 3.
Figure 4:
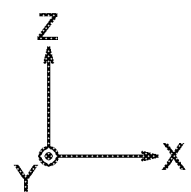

Next, as illustrated in FIG. 4, by using the first resist film 24 having a predetermined pattern, the wiring conductor film 8 is formed by a plating method, for example, using the underlying conductor film 22 as a seed on the surface of the underlying conductor film 22 not covered with the first resist film 24. The wiring conductor film 8 is a portion that is to be the intermediate wiring layer 8b illustrated in FIG. 1 and is formed by, for example, electrolytic copper plating.

Figure 5:
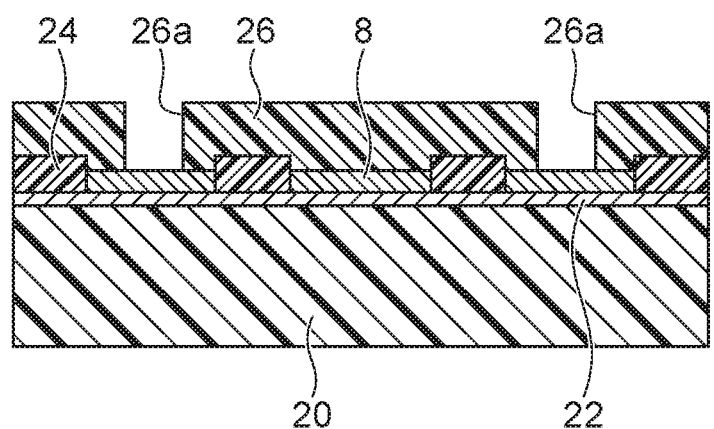
FIG. 5 is a schematic cross-sectional view illustrating a process subsequent to that of FIG. 4.

Next, as illustrated in FIG. 5, a second resist film 26 is formed in a predetermined pattern on the surface of the wiring conductor film 8 in a state where the first resist film 24 remains. Through holes 26a are formed in the second resist film 26 in a pattern for forming the post electrodes 10 illustrated in FIG. 1. In addition, after removing the first resist film 24 illustrated in FIG. 5, the second resist film 26 may be formed in a predetermined pattern.

Figure 6:
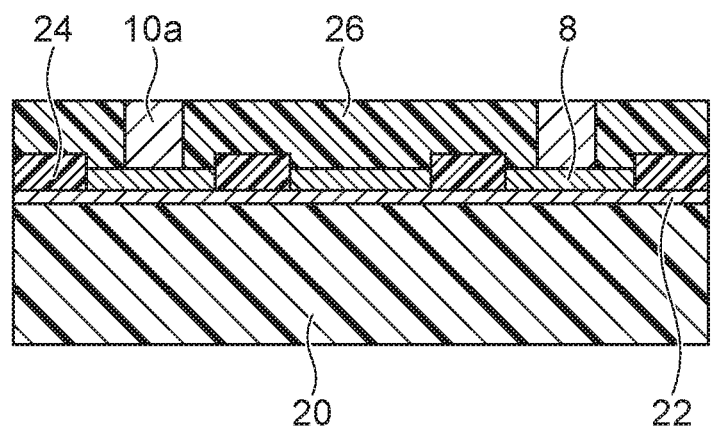
FIG. 6 is a schematic cross-sectional view illustrating a process subsequent to that of FIG. 5.

Next, as illustrated in FIG. 6, a conductor post 10a is formed on the surface of the wiring conductor film 8 not covered with the second resist film 26, for example, by an electrolytic copper plating method. The conductor post 10a is a portion that is to be the post electrode 10 in FIG. 1.

In addition, although not illustrated, a frame body may be formed along the outer peripheral frame of the support board 20. The frame body is used to prevent the raw material powder from protruding outside at the time of applying the raw material powder for forming the insulating layer 6 on the wiring conductor film 8 in a later process. The frame body may be removed from the final product or may remain.

Figure 7:
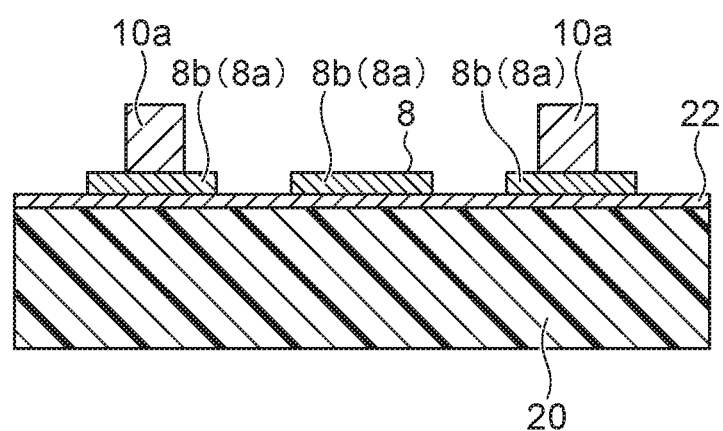
FIG. 7 is a schematic cross-sectional view illustrating a process subsequent to that of FIG. 6.

Next, as illustrated in FIG. 7, the first resist film 24 and the second resist film 26 illustrated in FIG. 6 are removed. As a result, the wiring conductor film 8 having a predetermined pattern remains on the surface of the underlying conductor film 22. A portion of the wiring conductor film 8 becomes the surface wiring layer 8a or the intermediate wiring layer 8b illustrated in FIG. 1, and the conductor post 10a is connected and remains on the surface wiring layer 8a or the intermediate wiring layer 8b.

In addition, in the present embodiment, the outer diameter of the conductor post 10a is preferably smaller than the thickness of each of the wiring layers 8a and 8b. As described above, the thickness of each of the wiring layers 8a and 8b can be preferably 10 µm or less, more preferably 7 µm or less. The outer diameter of the conductor post 10a is not particularly limited as long as the electric resistance does not become too high.

Figure 8:
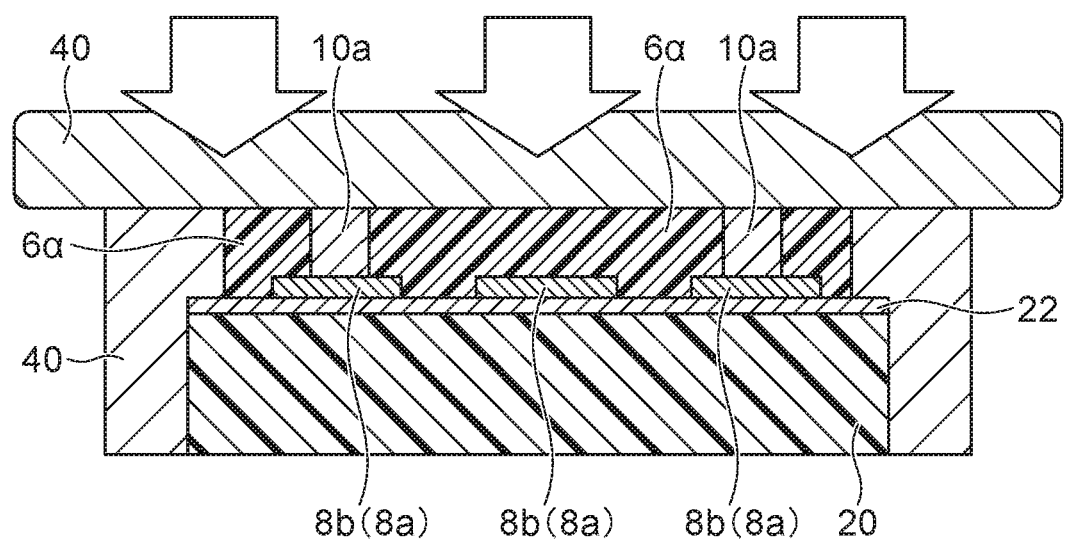
FIG. 8 is a schematic cross-sectional view illustrating a process subsequent to that of FIG. 7.
Figure 8:
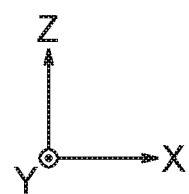

Next, as illustrated in FIG. 8, the insulating layer resin powder (multilayer board powder) 6α is applied so as to cover the surface of the underlying conductor film 22 of the support board 20 and the surface of the intermediate wiring layer 8b. The application method is not particularly limited. As a method of applying the insulating layer resin powder 6α of the present embodiment, for example, screen printing, electrostatic printing, or the like may be exemplified. In addition, even an insulating layer resin powder 6α containing no solvent or the like may be easily applied only to a predetermined portion in a fixed state without re-scattering by using electrostatic printing using a screen plate.

The insulating layer resin powder 6α is a resin powder for forming the insulating layer 6 illustrated in FIG. 1 and is preferably configured as a thermoplastic resin powder having a melting point of 250 to 350° C., for example, an LCP powder.

The structure of the compound constituting the LCP powder is not particularly limited. As the structure of the compound constituting the LCP powder, for example, a structure represented by the following chemical formula (1) may be exemplified.

[Chemical Formula 1]

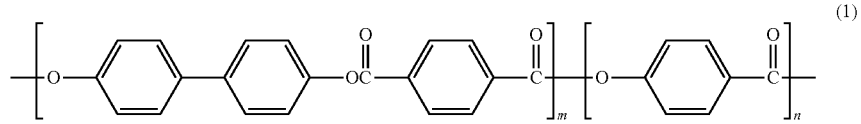

(1)

The particle size of the LCP powder is preferably 5 to 50 µm.

The insulating layer resin powder 6α contains the above-described reducing agent in addition to the LCP powder. The concentration of the reducing agent in the insulating layer resin powder 6α is not particularly limited. In present embodiment, the concentration of the reducing agent in the insulating layer resin powder 6α may be determined by considering heat treatment conditions and the like so that the sheet formed by heat-treating the insulating layer resin powder contains a reducing component having an amount of 30 to 200 ppm by mass, more preferably 50 to 100 ppm by mass.

By forming the sheet with the insulating layer resin powder containing the reducing component, the reducing component is also contained in the sheet, and by stacking the sheet, the effect of removing the oxide film on the surface of the connection conductor post 10a can be obtained.

Figure 9:
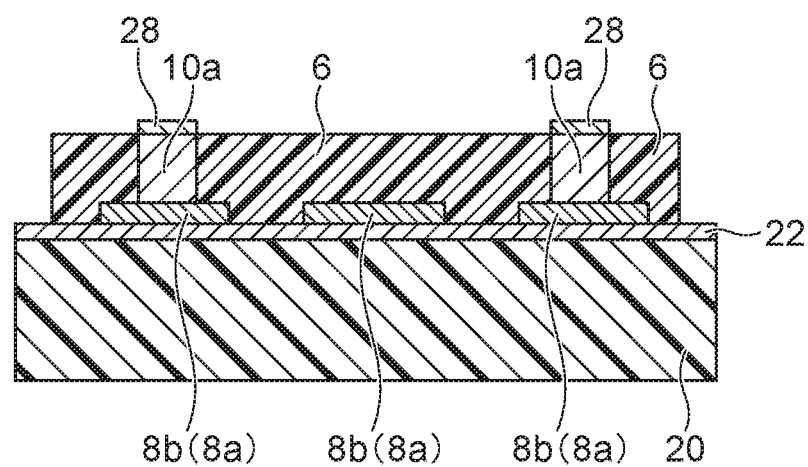
FIG. 9 is a schematic cross-sectional view illustrating a process subsequent to that of FIG. 8.

Next, as illustrated in FIG. 8, the insulating layer resin powder 6α is melted by hot-pressing (sheet molding hot-pressing) from the upper portion of in the Z-axis, and the sheet-like insulating layer 6 illustrated in FIG. 9, that is, the multilayer board insulating sheet is formed. The temperature at the time of the sheet molding hot-pressing is preferably a temperature equal to or higher than the melting point of the thermoplastic resin constituting the insulating layer resin powder 6α and a temperature equal to or lower than the thermal decomposition temperature of the thermoplastic resin constituting the insulating layer resin powder 6α, more preferably about 10 to 50° C. higher than the melting point of the thermoplastic resin constituting the insulating layer resin powder 6α. The pressure at the time of the sheet molding hot-pressing is not particularly limited, but the pressure may be approximately a pressure at which the sheet-like insulating layer 6 having a predetermined thickness can be molded from the insulating layer resin powder 6α.

In addition, if necessary, the polishing process for the upper surface of the insulating layer 6 may be performed in order to planarize the upper surface of the insulating layer 6 or to remove a surplus insulating layer 6 adhered to the top of the conductor post 10a. The polishing method is not particularly limited, but a chemical mechanical polishing (CMP) method, a grindstone polishing method, a fly cut method, and the like is exemplified.

The concentration of the reducing agent in the sheet-like insulating layer 6 after the sheet molding hot-pressing is preferably 30 to 200 ppm by mass, more preferably 50 to 100 ppm by mass.

Since the concentration of the reducing agent in the sheet-like insulating layer 6 after the sheet molding hot-pressing is within the above-mentioned ranges, the effect of removing the oxide film can be obtained, and the generation of the air gaps (voids) in the insulating layer 6 by the reducing agent can be suppressed.

Although an insulating layer resin powder 6a before the sheet molding hot-pressing contains the reducing agent, a portion of the reducing agent may volatilize at the time of the sheet molding hot-pressing. For this reason, the concentration of the reducing agent in the sheet-like insulating layer 6 after the sheet molding hot-pressing becomes lower than the concentration of the reducing agent in the insulating layer resin powder 6a.

Figure 10:
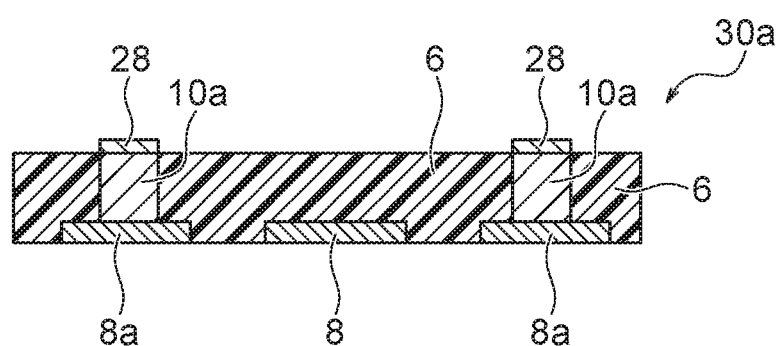
FIG. 10 is a schematic cross-sectional view illustrating a process subsequent to that of FIG. 9.
Figure 10:
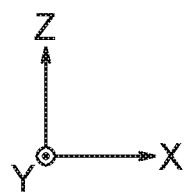

Next, as illustrated in FIG. 10, a board unit 30a can be formed by forming the conductor connection film 28 on the top of the conductor post 10a. As a method for forming the conductor connection film 28 on the top of the conductor post, a plating method, an electrolytic plating method, an electroless plating method, a DIP method, or the like is exemplified.

The conductor connection film 28 is configured with a metal having a melting point that is lower than the melting points of the metals constituting the conductor posts 10a and the surface wiring layer 8a (or the intermediate wiring layer 8b).

Figure 11:
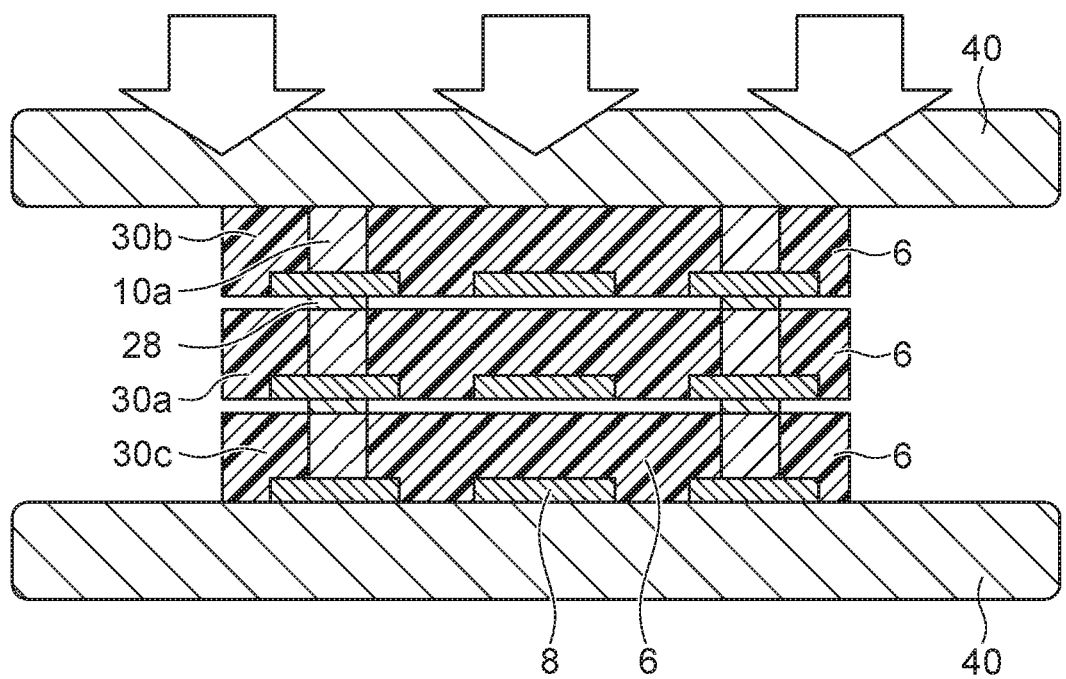
FIG. 11 is a schematic cross-sectional view illustrating a process subsequent to that of FIG. 10.

In the same manner as the manufacturing processes illustrated in FIGS. 2 to 10 described above, for example, board units 30b and 30c illustrated in FIG. 11 can be manufactured in addition to the board unit 30a illustrated in FIG. 10. In addition, when the board units 30a to 30c are to be stacked and hot-pressed (collectively stacked and hot-pressed), the support board 20 and the underlying conductor film 22 illustrated in FIG. 9 are removed from the board units 30a to 30c.

As illustrated in FIG. 11, the board units 30a to 30c are collectively stacked and hot-pressed by a hot-pressing device 40. In addition, although not illustrated, a conductor foil may be provided between the board unit 30b and the hot-pressing device, and the board units 30a to 30c may be stacked together with the conductor foil. The conductor foil is configured with, for example, a metal, for example, a copper foil this is similar to the metal constituting wiring layers 8a and 8b. The surface wiring layer may be configured by stacking the conductor foil on the uppermost portion in the stacking direction and patterning the stacked layer by etching or the like.

At the time of the collective stacking hot-pressing, the insulating layers 6 adjacent to each other in the stacking direction are thermally fused together, and by using the low-melting-point conductor connection film 28, the conductor post 10a and the intermediate wiring layer 8b are connected, and the conductor post 10a and the conductor foil are connected. The temperature at the time of the collective stacking hot-pressing is preferably a temperature equal to or lower than the melting point of the thermoplastic resin constituting the insulating layer 6 and is preferably higher than the melting point of the conductor connection film 28.

Thus, the multilayer board 2 illustrated in FIG. 1 can be manufactured.

If Sn, Ag, Sn—Ag, Cu—Ag, Sn—Cu, Sn—Ni, Sn—Zn, or the like is used as a metal constituting the conductor connection film 28, an oxide film is formed on the surface of the conductor connection film 28. Even in a case where the conductor connection film 28 is not formed, if the conductor post 10a is configured with Cu or the like, an oxide film is formed on the surface portion of the conductor post 10a exposed to air.

If the oxide film is formed on the surface of the conductor connection film 28 in this manner, the metal constituting the conductor connection film 28 is not easily melted at the time of the collective stacking hot-pressing, and voids may be generated, so that it is difficult to wet and spread the metal constituting the conductor connection film 28 on the entire surface of the conductor post 10a. As a result, the connection between the conductor post 10a and the conductor wiring layer tends to be insufficient.

In addition, in a case where the conductor connection film 28 is not formed and the conductor post 10a is configured with Cu or the like, if an oxide film is formed on the surface portion of the conductor post 10a exposed to air, the connection between the conductor post 10a and the conductor wiring layer becomes insufficient.

In order to remove the oxide film, it is considered to set the atmosphere to a reducing atmosphere by using a formic acid or the like at the time of the collective stacking hot-pressing. However, at the time of the collective stacking hot-pressing, since it is necessary to perform vacuum in order to prevent voids due to air residues between layers, the reducing atmosphere cannot be set.

In addition, it is also considered to remove the oxide film by applying a flux. However, there is a demand for avoiding using the flux as much as possible because of the influence of the residues.

In the present embodiment, the reducing agent is contained in the insulating layer resin powder 6α. For this reason, even at the time of performing the collective stacking hot-pressing in the air atmosphere, by volatilizing and decomposing the reducing agent, the oxide film formed on the surface of the conductor connection film 28 can be removed at the time of performing the collective stacking hot-pressing.

As a result, the metal constituting the conductor connection film 28 is easily melted at the time of the collective stacking hot-pressing, the air gaps are hardly generated, and the metal constituting the conductor connection film 28 can be wetted and spread over the entire surface of the conductor post 10a, so that the connection between the conductor post 10a and the conductor wiring layer is improved. In addition, in the present embodiment, the improved connection can be obtained without applying the flux to the conductor post 10a.

Furthermore, in the present embodiment, the melting point of the conductor connection film 28 is lower than the melting point of each of the wiring layers 8a and 8b, and the temperature at the time of the collective stacking hot-pressing is a temperature equal to or lower than the melting point of the thermoplastic resin of the insulating layer 6 and is higher than the melting point of the conductor connection film 28.

With such a configuration, it is possible to easily simultaneously perform the bonding between the thermoplastic resins constituting the board units 30a to 30c and the connection between the wiring layers 8a and 8b of the board units 30a to 30c adjacent to each other in the stacking direction and the conductor post 10a.

When the melting point of the thermoplastic resin is denoted by T1, the boiling point, the decomposition temperature, or the sublimation temperature of the reducing agent is denoted by T2, and the melting point of the metal constituting the conductor connection film 28 is denoted by T3, it is preferable that T1, T2, and T3 satisfy the relationship of $T2 \leq T3 < T1$. Accordingly, it is possible to volatilize the reducing agent and to melt the metal constituting the conductor connection film 28 at the time of the collective stacking hot-pressing, while preventing the structure of the insulating layer 6 from being damaged by excessive heat.

In addition, in the multilayer board 2 according to the present embodiment, a post electrode 10 penetrating the insulating layer 6 is provided inside the board main body 4. Since the multilayer board 2 has the post electrodes 10, three-dimensional circuit connection for connecting the post electrodes and circuits can be implemented.

In addition, in the method of manufacturing the multilayer board according to the present embodiment, as illustrated in FIG. 11, it is possible to simultaneously perform the thermal fusion bonding between the insulating layers 6 constituting the board units 30a to 30c and the connection between the wiring layers 8a and 8b of the board units 30a to 30c adjacent to each other in the stacking direction and the conductor post 10a y. As a result, it is possible to easily manufacture the multilayer board 2.

In addition, the invention is not limited to the above-described embodiment, and the invention can be variously modified within the scope of the invention.

For example, a capacitor or an inductor may be prepared in advance and buried in the multilayer board 2 illustrated in FIG. 1. In addition, a capacitor or an inductor may be manufactured simultaneously with the multilayer board 2 illustrated in FIG. 1.

For example, in the above-described embodiment, as illustrated in FIG. 11, the thermal fusion bonding between the insulating layers 6 constituting the board units 30a to 30c and the connection between the wiring layers 8a and 8b of the board units 30a to 30c adjacent in the stacking direction and the conductor post 10a are simultaneously performed, but a plurality of sets of stacked board units configured with two board units where the thermal fusion bonding between the insulating layers and the connection between the wiring layers adjacent in the stacking direction and the conductor post are performed may be prepared in advance, and the multilayer board may be formed by stacking these sets of stacked board units. The hot-pressing at the time of stacking the multilayer board units in this manner is also included in the collective stacking hot-pressing.

For example, in the above-described embodiment, the insulating layer resin powder 6α containing the reducing agent is used, but the timing at which the sheet-like insulating layer 6 is allowed to contain the reducing agent is not particularly limited. For example, the reducing agent may be added to the sheet-like insulating layer 6 before molding the sheet-like insulating layer 6 and performing the collective stacking hot-pressing. In the case of post-adding the reducing agent to the sheet-like insulating layer 6, it is preferable that the concentration of the reducing agent in the sheet-like insulating layer 6 including the post-added reducing agent is within the above-mentioned range.

For example, in the above-described embodiment, three board units 30a to 30c are collectively stacked, but the number of board units to be collectively stacked is not particularly limited, and for example, 10 to 50 layers of the board units can be stacked.

EXAMPLE

Example 1

As illustrated in FIG. 2, the support board 20 on which the underlying conductor film 22 has been formed in advance was prepared, and as illustrated in FIG. 3, the first resist film 24 having a predetermined pattern is formed on the underlying conductor film 22 of the support board 20.

Next, as illustrated in FIG. 4, the wiring conductor film 8 was formed on the surface of the underlying conductor film 22 not covered with the first resist film 24 by using a first resist film 24 having a predetermined pattern by electrolytic copper plating using the underlying conductor film 22 as a seed.

Next, as illustrated in FIG. 5, the second resist film 26 was formed in a predetermined pattern on the surface of the wiring conductor film 8 in a state where the first resist film 24 remains. The through-holes 26a having a pattern for forming the post electrodes 10 were formed in the second resist film 26.

Next, as illustrated in FIG. 6, the conductor posts 10a were formed by an electrolytic copper plating method on the surface of the wiring conductor film 8 not covered with the second resist film 26.

Next, as illustrated in FIG. 7, the first resist film 24 and the second resist film 26 were removed, and the wiring conductor film 8 having a predetermined pattern was formed on the surface of the underlying conductor film 22.

Next, as illustrated in FIG. 8, the insulating layer resin powder 6α was applied by electrostatic printing so as to cover the surface of the underlying conductor film, the surface of the surface wiring layer or the intermediate wiring layer of the support board 20.

The insulating layer resin powder 6α contained an LCP powder represented by the following chemical formula (1) and benzoic acid and salicylic acid as the reducing agents.

[Chemical Formula 1]

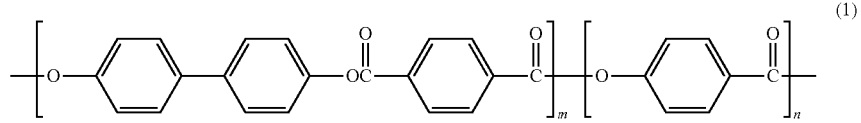

(1)

The concentrations of the benzoic acid and the salicylic acid as the reducing agents in the insulating layer resin powder 6α were as shown in Table 1.

Next, the insulating layer resin powder 6α was melted by hot-pressing (sheet molding hot-pressing) from the upper portion in the Z-axis, and thus, the sheet-like insulating layer 6, that is, the multilayer board insulating sheet was formed. The temperature at the time of the sheet molding hot-pressing was 350° C., and the pressure was 2 MPa.

The concentration of the reducing agent in the sheet-like insulating layer 6 after the sheet molding hot-pressing was as shown in Table 1.

Next, the board unit 30a was formed by forming the conductor connection film 28 on the top of the conductor post 10a. In addition, the conductor connection film 28 was formed by Sn—Ag plating.

Two board units 30b and 30c were manufactured in the same manner as the manufacturing processes described above. In addition, when the board units 30a to 30c are to be stacked and hot-pressed (collectively stacked and hot-pressed), the support board 20 and the underlying conductor film 22 have been removed from the board units 30a to 30c.

The support board 20 and the underlying conductor film 22 were removed from the board units 30a to 30c, and the collective stacking hot-pressing was performed by a hot-pressing device.

The temperature at the time of the collective stacking hot-pressing was 300° C.

Thus, the multilayer board 2 illustrated in FIG. 1 was manufactured.

The concentrations of benzoic acid and salicylic acid in the insulating layer 6 of the multilayer board 2 were as shown in Table 1.

<Method of Measuring Concentration of Reducing Agent>

Both the insulating layer in the multilayer board insulating sheet and the insulating layer in the multilayer board were measured by a P&T-GC-MS (purge&trap gas chromatograph/mass spectrometry) method. Each condition was as follows.

Purge and trap conditions were as follows.
Sample heater (sample purge) temperature: 300° C.
Heat extraction (sample purge) time: 15 minutes
Oven temperature: 230° C.
Needle temperature: 300° C.
Transfer temperature: 250° C.
Adsorbing agent: quartz wool (−60° C.)

The conditions of the gas chromatograph were as follows.
Column used: J&W DB-5 ms 30 m*0.25 mm φ0.25 μm df
Column temperature: After maintaining at 40° C. for 3 minutes, the temperature was increased at 10° C./min and maintained at 300° C. for 15 minutes.
Carrier gas: He 2 mL/min (split ratio 100:1)
Interface temperature: 300° C.
The conditions for mass spectrometry were as follows.
Scan mode
Scanning mass range: 33 to 500
EM voltage: 0.86 kV
<Observation of Connection Portion>

With respect to the obtained multilayer board, the connection between the post electrode and the intermediate wiring layer was observed with a microscope, and the state of connection was examined. A good case is indicated by A, a slightly bad case is indicated by B, and a bad case is indicated by C. Table 1 lists the results.

Example 2, Reference Example 1, and Comparative Example 1

The multilayer board was manufactured in the same manner as in Example 1, and the connection portion was observed except that the concentrations of benzoic acid and salicylic acid in the insulating layer in the multilayer board insulating sheet and the insulating layer in the multilayer board were changed as shown in Table 1.

Figure 12A:
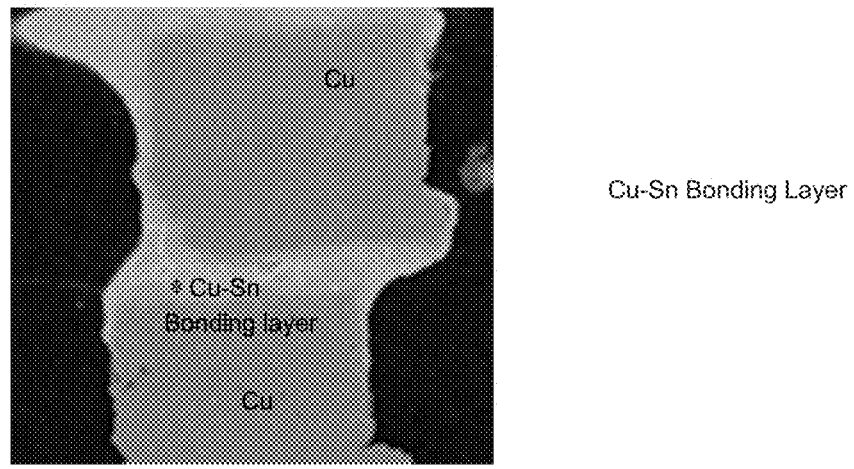
FIG. 12A is an SEM image showing a connection portion between a post electrode and an intermediate wiring layer in Example 1.
Figure 12B:
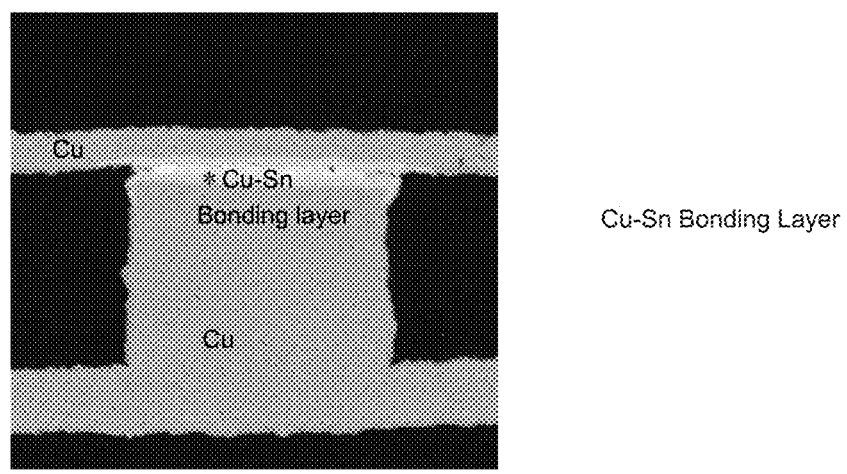
FIG. 12B is an SEM image showing a connection portion between a post electrode and an intermediate wiring layer in Example 2.
Figure 12C:
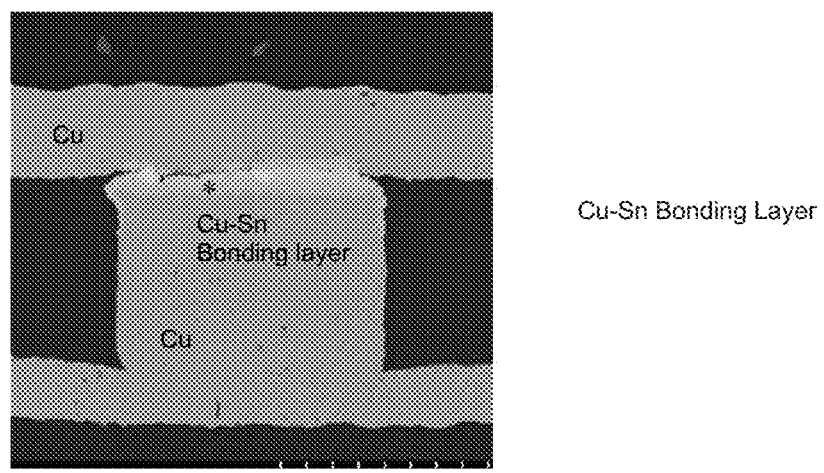
FIG. 12C is an SEM image showing a connection portion between a post electrode and an intermediate wiring layer in Reference Example 1.
Figure 12D:
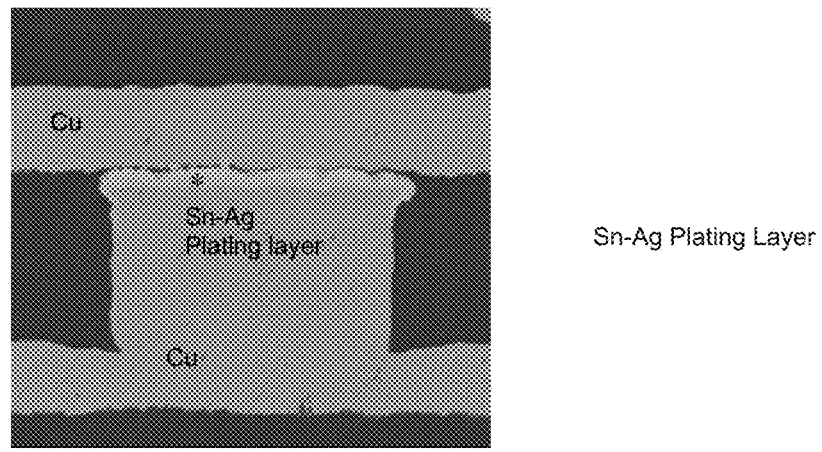
FIG. 12D is an SEM image showing a connection portion between a post electrode and an intermediate wiring layer in Comparative Example 1.

FIG. 12A is an SEM image showing the connection portion between the post electrode and the intermediate wiring layer in Example 1, FIG. 12B is an SEM image showing the connection portion between the post electrode and the intermediate wiring layer in Example 2, FIG. 12C is an SEM image showing the connection portion between the post electrode and the intermediate wiring layer in Reference Example 1, and FIG. 12D is an SEM image showing the connection portion between the post electrode and the intermediate wiring layer in Comparative Example 1.

collective stacking hot-pressing, and as a result, Sn that is a metal constituting the conductor connection film was easily melt, and Sn was wetted and spread over the entire surface of the conductor post.

Experimental Example 1

Only the Cu foil of 180 mm square was heated at 350° C. for 30 minutes. An image illustrating the results is shown in FIG. 13A.

Experimental Example 2

The Cu foil was heated in the same manner as in Experimental Example 1 except that the powder containing the reducing component was placed at the center of the Cu foil. An image illustrating the results is shown in FIG. 13B.

Figure 13A:
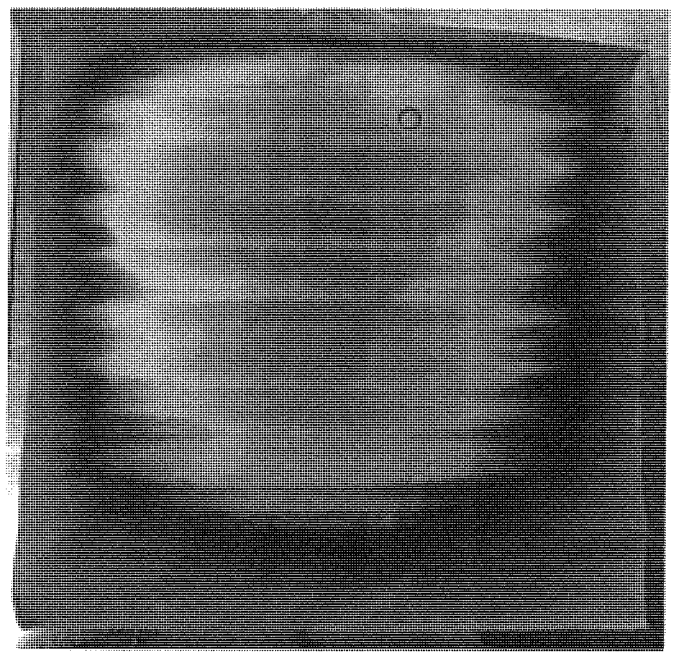
FIG. 13A is an image showing a copper foil in Experimental Example 1.
Figure 13B:
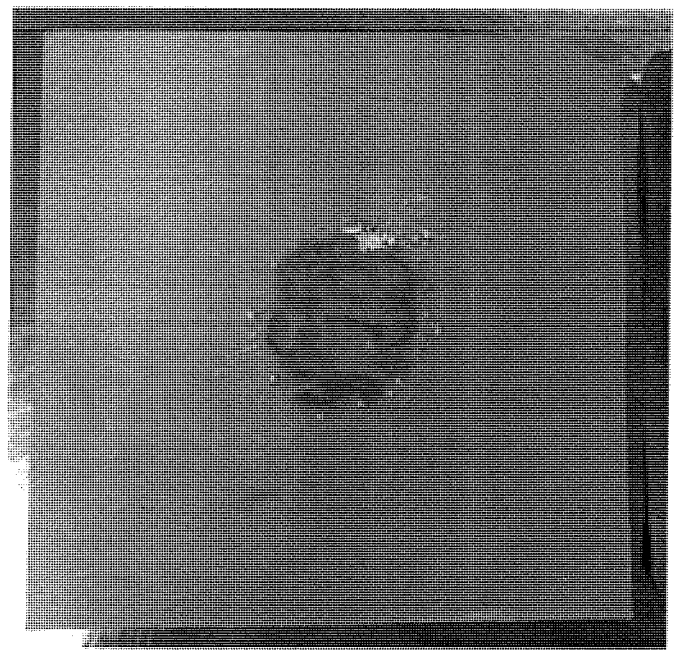
FIG. 13B is an image showing a copper foil in Experimental Example 2.

From FIG. 13A, it can be confirmed that almost the entire surface of the Cu foil has been discolored due to oxidation. On the other hand, from FIG. 13B, the discoloration due to the oxidation can not be confirmed. It is considered that this is because of a reduction effect by the reducing agent. In addition, it was also confirmed that the reduction effect was exerted not only to the portion where the reducing agent was added but also to the entire surface of the Cu foil. It is considered that this is because, by volatilizing the reducing agent, the reduction effect can be exerted to the entire surface of the Cu foil.

What is claimed is:

1. A multilayer board insulating sheet comprising an insulating layer, wherein the insulating layer contains a reducing agent and
wherein T2 is 200 to 250° C.,
in which a boiling point, a decomposition temperature, or a sublimation temperature of the reducing agent is denoted by T2.

TABLE 1

|  |  | Example 1 | Example 2 | Reference Example 1 | Comparative Example 1 |
| --- | --- | --- | --- | --- | --- |
| Insulating layer in multilayer board insulating sheet (after sheet molding hot-pressing) | Concentration of benzoic acid [ppm by mass] | 4 | 2 | 0 | 0 |
|  | Concentration of salicylic acid [ppm by mass] | 72 | 40 | 15 | 0 |
| Insulating layer in multilayer board (after collective stacking hot-pressing) | Concentration of benzoic Acid [ppm by mass] | 0 | 1 | 0 | 0 |
|  | Concentration of salicylic acid [ppm by mass] | 35 | 30 | 0 | 0 |
| Connection determination of connection post |  | A | A | B | C |

From FIGS. 12A and 12B, it can be confirmed that, in Examples 1 and 2, the post electrode of the multilayer board and the conductor wiring layer are well connected in the Cu—Sn bonding layer made of the Cu—Sn alloy. It is considered that this is because, since the reducing agent having an amount of 42 ppm by mass or more is contained in the multilayer board insulating sheet, the oxide film of the conductor connection film is removed at the time of the 2. The multilayer board insulating sheet according to claim 1, wherein a conductor post is buried in the insulating layer of the multilayer board insulating sheet.

3. The multilayer board insulating sheet according to claim 2,
wherein a conductor connection film is provided on a top surface of the conductor post, and wherein the conductor connection film is comprised of at least one selected from Sn, Ag, Sn—Ag, Cu—Ag, and Sn—Cu.

4. The multilayer board insulating sheet according to claim 1, wherein the insulating layer contains the reducing agent having an amount of 30 to 200 ppm by mass.

5. The multilayer board insulating sheet according to claim 3, wherein the insulating layer further comprises a thermoplastic resin, and
wherein a relationship of $T2 \leq T3 < T1$ is satisfied,
in which a melting point of the thermoplastic resin is denoted by T1, and a melting point of a metal constituting the conductor connection film is denoted by T3.

6. A multilayer board comprising:
a board main body having a plurality of insulating layers;
an intermediate wiring layer formed between the insulating layers; and
a post electrode formed inside at least one of the insulating layers so as to be electrically connected to a portion of the intermediate wiring layer,
wherein at least one of the insulating layers contains a reducing agent and wherein T2 is 200 to 250° C.,
in which a boiling point, a decomposition temperature, or a sublimation temperature of the reducing agent is denoted by T2.

7. The multilayer board according to claim 6,
wherein a portion of the intermediate wiring layer and the post electrode are electrically connected to each other via a conductor connection film, and
wherein the conductor connection film is comprised of at least one selected from Sn, Ag, Sn—Ag, Cu—Ag, and Sn—Cu.

8. The multilayer board according to claim 6, wherein at least one of the insulating layers contains the reducing agent having an amount of 5 to 100 ppm by mass.

9. The multilayer board according to claim 7, wherein at least one of the insulating layers comprises a thermoplastic resin, and
wherein a relationship of $T2 \leq T3 < T1$ is satisfied, in which a melting point of the thermoplastic resin is denoted by T1, and a melting point of a metal constituting the conductor connection film is denoted by T3.

10. The multilayer board insulating sheet according to claim 1, wherein the reducing agent is at least one selected from benzoic acid, phthalic acid and salicylic acid.

11. The multilayer board insulating sheet according to claim 1, wherein the reducing agent is benzoic acid or salicylic acid.

12. The multilayer board insulating sheet according to claim 1, wherein the insulating layer contains the reducing agent having an amount of 50 to 100 ppm by mass.

13. The multilayer board insulating sheet according to claim 6, wherein the reducing agent is at least one selected from benzoic acid, phthalic acid and salicylic acid.

14. The multilayer board insulating sheet according to claim 6, wherein the reducing agent is benzoic acid or salicylic acid.

15. The multilayer board insulating sheet according to claim 6, wherein the insulating layer contains the reducing agent having an amount of 50 to 100 ppm by mass.

* * * * *